United States Patent
Suzuki et al.

[11] Patent Number: 5,190,590
[45] Date of Patent: Mar. 2, 1993

[54] VACUUM COATING APPARATUS

[75] Inventors: Masaki Suzuki, Hirakata; Hidetoshi Kawa, Ibaragi; Shigeyuki Yamamoto, Nara; Nobuhisa Maeda, Yamatotakada, all of Japan

[73] Assignee: Matsushita Electric Industrial Co., Ltd., Osaka, Japan

[21] Appl. No.: 682,110

[22] Filed: Apr. 8, 1991

[30] Foreign Application Priority Data

Apr. 10, 1990 [JP] Japan ................................. 2-95723

[51] Int. Cl.⁵ ............................................. C23C 14/24
[52] U.S. Cl. ................................. 118/664; 118/727; 118/728; 427/9; 427/10
[58] Field of Search ............... 118/664, 719, 727, 728; 427/9, 10

[56] References Cited

U.S. PATENT DOCUMENTS

| | | | |
|---|---|---|---|
| 3,625,180 | 12/1971 | Smith | 118/727 |
| 3,695,217 | 10/1972 | Jacobson | 118/727 |
| 3,915,117 | 10/1975 | Schertler | 118/719 |
| 4,015,558 | 4/1977 | Small | 118/719 |
| 4,226,208 | 10/1980 | Nishida | 118/719 |
| 4,311,725 | 1/1982 | Holland | 427/10 |
| 4,313,254 | 2/1982 | Feldman | 118/719 |
| 4,632,059 | 12/1986 | Flatscher | 118/727 |
| 4,681,773 | 7/1987 | Bean | 118/719 |

FOREIGN PATENT DOCUMENTS

| | | | |
|---|---|---|---|
| 2412729 | 9/1975 | Fed. Rep. of Germany | 427/10 |
| 63-312972 | 12/1988 | Japan | 118/727 |
| 1-172569 | 7/1989 | Japan | 427/10 |
| 889743 | 12/1981 | U.S.S.R. | 118/727 |

*Primary Examiner*—Richard Bueker
*Attorney, Agent, or Firm*—Wenderoth, Lind & Ponack

[57] ABSTRACT

A vacuum coating apparatus for coating films on the surfaces of objects to be deposited under vacuum is provided with a vacuum deposition chamber, a carrier accommodated in the vacuum deposition chamber for carrying the objects, a rotary mechanism extending through the vacuum deposition chamber and being rotatable with respect to the carrier, and a container mounted on the rotary mechanism and accommodated in the vacuum deposition chamber. The container accommodates a material to be evaporated and is rotated by the rotary mechanism during a deposition operation while the objects are maintained stationary.

2 Claims, 4 Drawing Sheets

VACUUM COATING APPARATUS

BACKGROUND OF THE INVENTION

1. Field of the Invention

The present invention relates to a vacuum coating apparatus for coating films on the surfaces of electronic components, lenses or the like by evaporating a film material under a vacuum.

2. Description of the Prior Art

In a vacuum coating apparatus, a material to be deposited on object surfaces is generally accommodated in a heating element called a "boat" or a crucible and is positioned so as to confront objects to be coated. The material is evaporated by means of resistance heating, high-frequency induction heating or the like. Evaporated particles are then deposited on the object surfaces to form films thereon. Conventionally, in order to form uniform films on the object surfaces, the deposition is performed by rotating the objects confronting the boat or an entire carrier for carrying the objects.

FIG. 1 depicts a conventional vacuum coating apparatus having a vacuum deposition chamber 1, a dish-like boat 10 accommodated in the vacuum deposition chamber 1, a pair of electrodes 11 connected to the boat 10, and a dome 15 in the form of a hemispherical shell disposed above the boat 0 and confronting the boat 10. The boat 10 accommodates a film material V. The electrodes 11 extend through the vacuum deposition chamber 1 and are connected to a power source via a transformer 12 disposed outside of the vacuum deposition chamber 1. A plurality of objects, for example lenses R, are arrayed and supported on the dome 15. The dome 15 is supported at its periphery by a ring gear 13, which is rotatably supported by a bearing mechanism 17 and meshes with a pinion gear 19 driven by a drive motor 16. A sheathed heater or heaters 18 are disposed above the dome 15 so as to cover it.

A through-hole is formed at the center of the dome 15 and a monitoring member M made of, for example, glass is disposed above the through-hole. A film thickness measuring device 14 is disposed outside of the vacuum deposition chamber 1 and above the monitoring member M and measures the thickness of a film deposited on the surface of the monitoring member M in order to grasp the state of films deposited on the surfaces of the lenses R.

In the vacuum coating apparatus having the above-described construction, since the dome 15 rotates along with the heated lenses R, the relative distances between the lenses R and the boat 10 and the directions and the angles of the lenses R relative to the boat 10 vary gradually during a deposition treatment. As a result, coating films of a substantially uniform thickness are formed on the lens surfaces.

The vacuum coating apparatus of the conventional construction is, however, disadvantageous in the installation and removal of the large-sized dome 15 is somewhat troublesome, thus making it difficult to automate the entire vacuum coating operation including the installation and removal of the objects onto and from the dome 15.

This vacuum coating apparatus is also disadvantageous in that replacing the monitoring member M is troublesome. Since the monitoring member M must be replaced by a new one whenever a vacuum deposition operation is completed, replacing of the monitoring member M must be replaced upon the installation and removal of the dome 15. In automating the deposition treatment, it is particularly difficult to supply and properly position a large number of monitoring members M stored at a predetermined location one-by-one because the inside of the vacuum deposition chamber 1 is under a vacuum and is at a high temperature. If a monitoring member M is mounted in advance on the dome 15 on which the lenses R are mounted, rotation of the dome 15 is accompanied by a rotation of the monitoring member M. As a result, it becomes impossible to accurately detect the thickness of a film formed on the monitoring member M from outside of the vacuum deposition chamber 1.

The conventional vacuum coating apparatus is still further disadvantageous in that it is rather difficult to lubricate the bearing mechanism 17 for rotatably supporting the ring gear 13 and the pinion gear 19 through which a driving force from the motor 16 is transmitted to the ring gear 13. More specifically, since the inside of the vacuum deposition chamber 1 is under a high vacuum and is at a high temperature of about 300° C., there is no perfectly satisfactory lubricant or no complete bearing means. It is, therefore, very difficult to maintain the rotation of the dome 15 under a desired condition.

SUMMARY OF THE INVENTION

The present invention has been developed to overcome the above-described disadvantages.

It is accordingly an object of the present invention to provide an improved vacuum coating apparatus for coating the surfaces of objects, which facilitates the set-up and removal of both the objects to be coated and a monitoring member through which the state of films formed on the object surfaces is observed.

Another object of the present invention is to provide a vacuum coating apparatus of the above-described type which is automated during the entire vacuum deposition operation.

In accomplishing these and other objects, a vacuum coating apparatus according to the present invention includes a vacuum deposition chamber, a carrier accommodated in the vacuum deposition chamber for carrying the objects, a rotary means extending through the vacuum deposition chamber so as to be rotatable with respect to the objects to be coated, and a heating element mounted on the rotary means and accommodating the material to be evaporated onto the object surfaces.

Preferably, the vacuum coating apparatus further includes a monitoring member mounted on the carrier and a film thickness measuring means disposed outside of the vacuum deposition chamber for measuring thicknesses of the films formed on the objects through the monitoring member.

In the conventional vacuum coating apparatus, the heating element accommodating the material to be evaporated is kept stationary whereas the objects to be coated are rotated during the deposition operation so that films may be uniformly formed on the surfaces thereof.

In contrast, in the vacuum coating apparatus according to the present invention, the objects to be coated are kept stationary in the vacuum deposition chamber whereas the heating element accommodating the material is rotated during the deposition operation. Even in this construction, substantially uniform films can be formed on the object surfaces because the positions and the postures of the objects relative to the material is changed by rotating the material to be evaporated.

In this construction, because the carrier carrying the object is not rotated, the vacuum coating apparatus according to the present invention requires no bearing mechanisms within the vacuum deposition chamber, the inside of which is under a vacuum and is at a high temperature. As a result, the vacuum coating apparatus is free from problems relating to lubrication.

Furthermore, since the carrier carrying the objects does not rotate, the transportation thereof can easily be mechanized and automated. In addition, the monitoring member can be mounted on the carrier at a location outside of the vacuum chamber. As a result, it becomes possible to correctly measure the thickness of a film formed on the surface of the monitoring member.

In another aspect of the present invention, a vacuum coating apparatus has a vacuum deposition chamber, an inlet chamber formed on one side of the vacuum deposition chamber and having an inlet gate through which objects to be coated are introduced thereinto prior to deposition, an outlet chamber formed on the other side of the vacuum chamber and having an outlet gate through which the objects are discharged therefrom after the deposition, and a pair of intermediate gates interposed between the inlet chamber and the vacuum deposition chamber and between the vacuum deposition chamber and the outlet chamber, respectively.

The vacuum coating apparatus further has a carrier for carrying the objects, and a plurality of conveyor means disposed inside the three chambers for transporting the carrier along with the objects.

BRIEF DESCRIPTION OF THE DRAWINGS

These and other objects and features of the present invention will become more apparent from the following description taken in conjunction with the preferred embodiment thereof with reference to the accompanying drawings, throughout which like parts are designated by like reference numerals, and wherein.

DETAILED DESCRIPTION OF THE PREFERRED EMBODIMENTS

Figure 2:
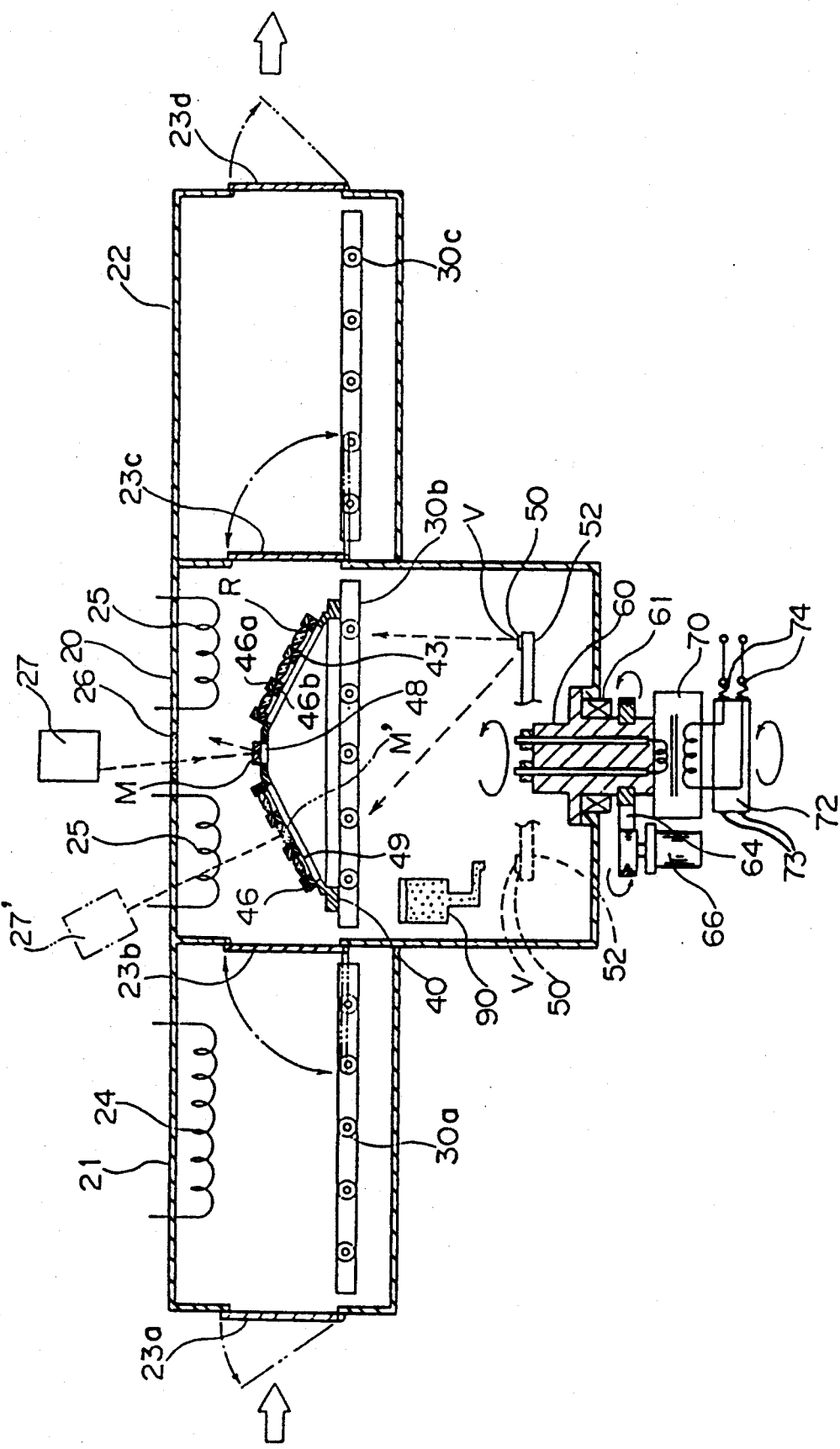
FIG. 2 is a schematic cross-sectional view of a vacuum coating apparatus according to the present invention.

Referring now to the drawings, there is shown in FIG. 2 a vacuum coating apparatus according to one preferred embodiment of the present invention.

The vacuum coating apparatus is provided with a vacuum deposition chamber 20, an inlet chamber 21 formed on one side of the vacuum deposition chamber 20, and an outlet chamber 22 formed on the other side of the vacuum deposition chamber 20. These three chambers 20–22 communicate with one common or respective vacuum mechanisms (not shown), similar to conventional vacuum coating apparatus. The vacuum mechanisms evacuate the chambers 20–22 so that the inside of the vacuum deposition chamber 20 may be brought into a high vacuum condition suitable for vacuum deposition. An inlet gate 23a and an outlet gate 23d are pivotably or slidably mounted on the inlet chamber 21 and the outlet chamber 22, respectively. Two intermediate gates 23b and 23c are pivotably or slidably interposed between the inlet chamber 21 and the vacuum deposition chamber 20 and between the vacuum deposition chamber 20 and the outlet chamber 22, respectively. The provision of the gates 23a–23d can make individual chambers 20–22 airtight as occasion demands. Objects to be coated are charged in the inlet chamber 21 through the inlet gate 23a and are discharged from the outlet chamber 22 through the outlet gate 23d. The inlet chamber 21 is internally provided at an upper portion thereof with at least one heater 24 for keeping the objects at a desired temperature prior to a deposition operation.

The three chambers 20–22 are internally provided with respective conveyor mechanisms 30a–30c, which can horizontally move a carrier 40 for carrying pallets 46 on which the objects are mounted. The carrier 40 is initially introduced to the inlet chamber 21 and is then transported to the vacuum deposition chamber 20 and to the outlet chamber 22.

Figure 1:
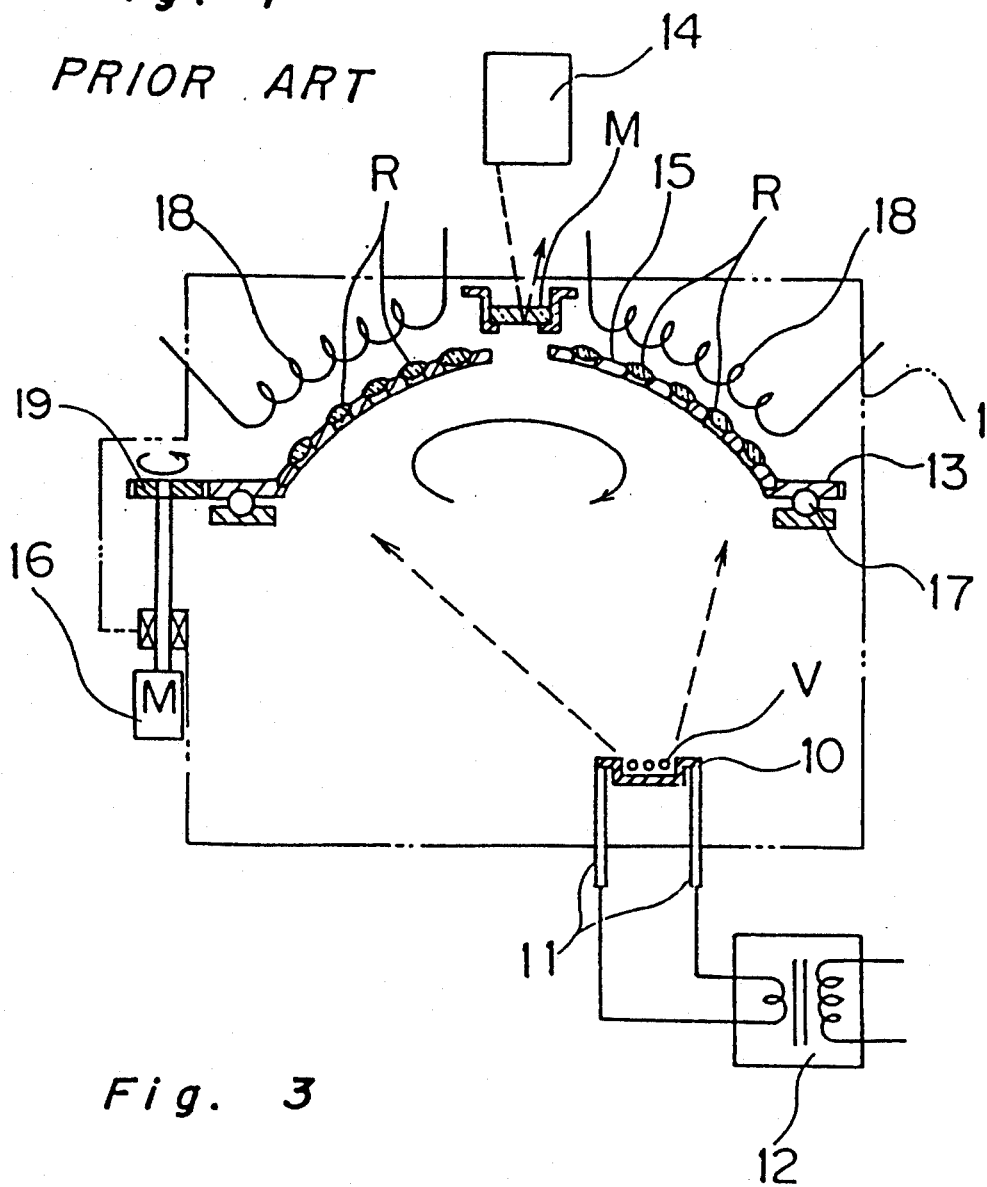
FIG. 1 is a schematic cross-sectional view of a conventional vacuum coating apparatus.
Figure 3:
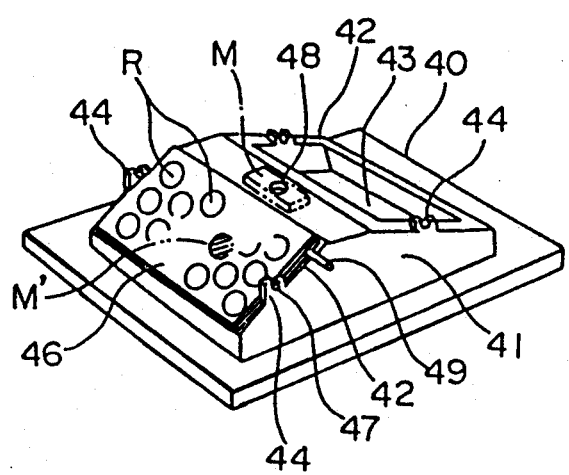
FIG. 3 is a perspective view of a carrier for use in the vacuum coating apparatus of FIG. 2.

In this embodiment, coating films for preventing reflection are deposited on both surfaces of a number of lenses R. These lenses R are mounted, as the objects to be coated, on the pallets 46, as shown in FIG. 3.

The vacuum deposition chamber 20 is internally provided at an upper portion thereof with one or more heaters 25 for heating the lenses R and the pallets 46. A transparent windowpane 26 for monitoring use is securely fitted substantially at the center of a ceiling of the vacuum deposition chamber 20.

A material V to be evaporated is accommodated in a heating element (boat) 50, which is horizontally rotatably mounted at a lower portion of the vacuum deposition chamber 20.

Figure 4:
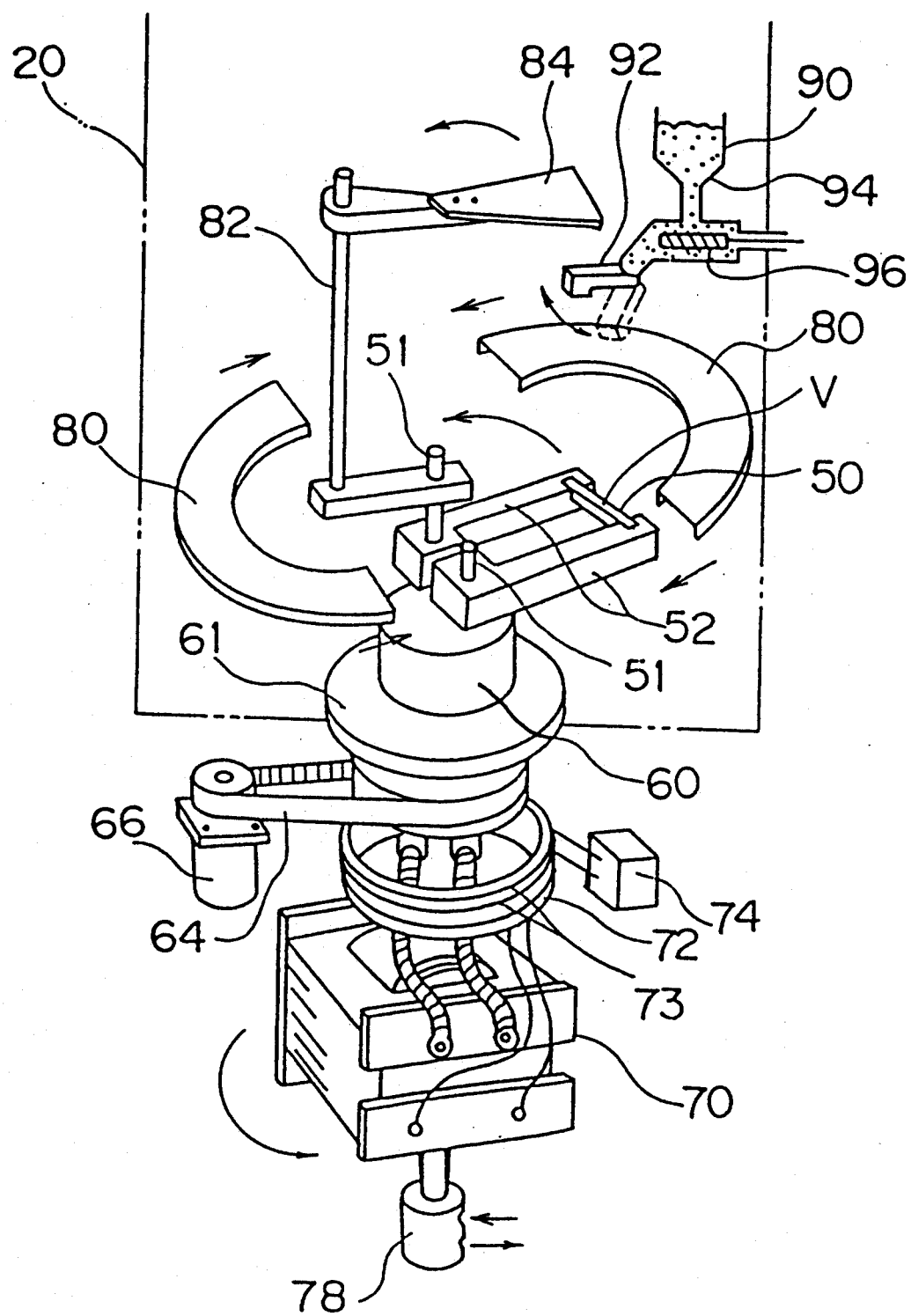
FIG. 4 is a perspective view of a rotary mechanism provided in the vacuum coating apparatus of FIG. 2.

As shown in FIG. 4, the boat 50 is carried by distal ends of a pair of horizontally extending electrodes 52. Proximal ends of these electrodes 52 are respectively carried by a pair of electrodes 51, which vertically extend through and protrude downwards from a rotary bearing 60. The rotary bearing 60 extends through a bottom wall of the vacuum deposition chamber 20 and is rotatably supported thereon via a magnetic fluidic sealing mechanism 61. A lower portion of the rotary bearing 60 protrudes downwards from the chamber wall of the vacuum deposition chamber 20, as shown in FIG. 2.

The lower portion of the rotary bearing 60 is driven by a drive motor 66 via a transmission belt 64 at a location outside of the vacuum deposition chamber 20. The drive motor 66 rotates the rotary bearing 60, which rotates the horizontally extending electrodes 52 mounted on the upper end of the rotary bearing 60, thereby rotating the boat 50 mounted on the distal ends of the electrodes 52.

Below the rotary bearing 60 is supported a transformer 70, which rotates together therewith. The transformer 70 is provided for converting about 200V, 10A three phase commercial power to about 10V, 200A power necessary for heating the boat 50. The transformer 70 is electrically connected at its output side to the pair of vertically extending electrodes 51 and at its input side to the commercial power via electronically conductive slip rings 73 mounted on a rotary during 72 and brushes 74 high-current power can easily be applied to the rotating boat 50 by applying high-voltage small-current power to the slip ring 73.

A rotary joint 78 is disposed below the transformer 70, and cooling water introduced thereinto is supplied to the inside of the electrodes 51 and 52 to cool them. Thereafter, the cooling water returns back to the rotary joint 78 and is discharged therefrom.

Above a circular path of the rotating boat 50 are disposed a pair of shutters 80 in semicircular arc form, which can move radially with respect to the rotational center of the boat 50. When both the shutters 80 move inwards, they cover the circular path over which the boat 50 is rotated to suspend the deposition of the material V onto the lenses R. In contrast, when both the shutters 80 move outwards to expose the material V, the deposition of the material V onto the objects is performed.

One of the vertically extending electrodes 51 is connected to one end of an extension arm 82, the other end of which is connected to a film thickness regulating plate 84. The range over which the material V is covered can be changed by regulating the location, configuration and size of the film thickness regulating plate 84. By doing so, the amount of particles evaporated from the material V and directed to the objects to be deposited is changed, thereby regulating the distribution in thickness of the deposited films formed on the surfaces of the objects.

Above the path of the boat 50 is disposed a material supply mechanism 90, which comprises a hopper 94 for accommodating a material V, for example MgF, to be deposited the surfaces of lenses R, a screw mechanism 96 for supplying a required amount of the material V accommodated in the hopper 94, and a nozzle 92 horizontally pivotably mounted on one end of the screw mechanism 96 with an open end thereof preferably orientated downwards. The nozzle 92 is movable between its supply position where the material V is supplied from the nozzle 92 to the boat 50 when the boat 50 has come to a halt at a predetermined location and its rest position remote from the supply position. When the nozzle 92 is located at the rest position, it never interferes with the deposition operation.

An object carrier for use in transporting the objects to be deposited will be discussed hereinafter.

As shown in FIG. 3, a rectangular carrier 40 has a roof 41 protruding upwards therefrom. The roof 41 of the carrier 40 has two inclined portions 42 symmetrically inclined, for example, about 15° downwards from the top thereof in opposite directions. Two rectangular pallets 46, on which a number of lenses R are placed, are mounted on these inclined portions 42 of the carrier 40. Each of the inclined portions 42 of the carrier 40 has a rectangular opening 43, through which evaporated particles are deposited on the surfaces of the lenses R from below. Two bearing members 44 are formed on each inclined portion 42 of the tray 40 in the proximity of the short sides of each opening 43. Two support rods 47 extending from the short sides of each pallet 46 are engaged with and carried by these bearing members 44, respectively. A relatively long handle 49 in the form of a rod extends from one of the short sides of each pallet 46 in the proximity of one corner thereof in parallel with the support rods 47. Each pallet 46 is weighted to one side with respect to a line connecting both the support rods 47 so that one long side thereof will be self-biased downwards towards the roof 41 of the carrier 40.

The top of the roof 41 is flat and a relatively small through-hole 48 is formed therein. A rectangular monitoring glass member M is fitted on the top of the roof 41 so as to cover the through-hole 48. Evaporated particles supplied from below are deposited on the lower surface of the monitoring glass member M through the through-hole 48. The thickness of a film formed on the monitoring glass member M is observed by a film thickness measuring device 27 disposed outside of the vacuum deposition chamber 20 through a windowpane 26 securely fitted on the vacuum deposition chamber 20.

It is to be noted that in this embodiment, although the monitoring member M is mounted on the top of the roof 41, it may be replaced by a monitoring member M' mounted on one of the pallets 46. In this case, a film thickness measuring device 27' is required to be located on a line perpendicular to the monitoring member M', as shown in FIG. 2.

Each of the pallets 46 comprises two rectangular plates 46a and 46b each having a number of through-holes 49 for receiving lenses R to be coated. The plates 46a and 46b are pivotably connected to each other so that the lenses R may be sandwiched therebetween prior to the deposition.

The vacuum coating apparatus having the above-described construction operates as follows.

As shown in FIG. 3, a number of lenses R to be coated are initially sandwiched between both the plates 46a and 46b of each of two pallets 46. These pallets 46 are then placed on the inclined portions 42 of the roof 41 of a carrier 40.

Thereafter, the carrier 40 is introduced into the vacuum deposition chamber 20 through the inlet chamber 21, as shown in FIG. 2. More specifically, a conveyor mechanism (not shown), disposed outside of the inlet chamber 21, is provided in addition to the conveyor mechanisms 30a–30c disposed inside the three chambers 20–22. A process for mounting the lenses R in the pallets 46, a process for placing the pallets 46 on the carrier 40, a process for fitting the monitoring member M, a process for preheating the lenses R, and the like are performed along the conveyor mechanism disposed outside of the inlet chamber 21. The lenses R may be automatically successively introduced into the vacuum deposition chamber 20 by any other suitable means.

When the carrier 40 reaches a predetermined location within the vacuum deposition chamber 20, it is brought to a halt there. The boat 50 is supplied with the material V from the material supply mechanism 90. Upon heating, the material V evaporates and forms deposited films on the surfaces of the lenses R mounted on the pallets 46 placed on the carrier 40. In this event, since the boat 50 is horizontally rotated, the relative distances between the lenses R and the boat 10 and the directions and the angles of the lenses R relative to the boat 50 vary gradually during a deposition treatment. As a result, the deposition is uniformly performed on all the lenses R wherever they are located on the pallets 46.

During this process, the deposition is also performed on the surface of the monitoring member M located at the top of the carrier 40. The degree of progress of the deposition can be known by observing the state of the monitoring member M through the windowpane 26 from outside of the vacuum deposition chamber 20 using the film thickness measuring device 27.

Upon completion of the deposition of the material onto the lower sides of the lenses R, the pallets 46 on the tray 40 are automatically turned upside down by rotating the respective handles 49 about the support rods 47. In this event, the monitoring member M is automatically slightly shifted by any suitable means so that the non-coated surface thereof may receive particles evaporated from the material V. Thereafter, the above-described deposition is again performed on the non-coated surfaces of the lenses R and the monitoring member M.

It is to be noted that any one of various mechanical or electrical reversing mechanisms as employed in the conventional vacuum coating apparatus can be employed as a reversing mechanism for turning the pallets 46 upside down.

Upon completion of the deposition, the intermediate gate 23c located between the vacuum deposition chamber 20 and the outlet chamber 22 is opened, and the tray 40 along with the lenses R is introduced into the outlet chamber 22 by the operation of the conveyor mechanisms 30b and 30c. The outlet gate 23d is then opened and the carrier 40 is discharged from the outlet chamber 22 through the outlet gate 23d by the operation of the conveyor mechanism 30c. Upon removal of the pallets 46 from the carrier 40, the lenses R along with the pallets 46 are subjected to a post-treatment. Alternatively, after the lenses R have been removed from the pallets 46, they may be subjected to the post-treatment. The carrier 40 from which the pallets 46 have been removed is again sent to the inlet side of the apparatus so that new pallets 46, on which a number of new lenses R are mounted, may be placed on the tray 40 for the next deposition operation.

It is to be noted here that various conventional vacuum coating devices can partially, solely or even in combination, be employed in the above-described coating apparatus in which, according to the present invention, the boat 50 accommodating the material V is rotated and supplied with electricity while the lenses R are kept stationary during the deposition and the monitoring glass member M is fitted to the carrier or a pallet.

For example, the boat 50 may be replaced by one for use in known high-frequency heating or known electron beam heating so long as that boat can rotate. The paired shutters 80 disposed above the boat 50, the film thickness regulating plate 84, and the material supply mechanism 90 can take modified forms. Although the carrier 40 and the pallets 46 having the above-described construction are well-suited for handling objects to be coated and for facilitating the mechanization and automation of the entire deposition processes, they can also take other forms. When the deposition is performed with respect to objects other than the lenses R, the construction and configuration of the pallets 46 and the carrier 40 conveniently will of course conform to the configuration and the number of the objects to be deposited.

In the above-described vacuum coating apparatus, although the objects to be coated are not rotated, the rotation of a boat accommodating a material to be evaporated can provide uniform films on the objects.

Since the objects are not rotated, a mechanism for rotating a carrier carrying the objects is not required, thereby facilitating charging and discharging of the objects into and from the vacuum coating apparatus.

Furthermore, the vacuum coating apparatus according to the present invention is free from problems associated with providing lubrication, because a rotary bearing, on which the heating element (boat) is mounted, is not subjected to high temperatures under a vacuum.

In addition, since a monitoring member can be mounted on a pallet or a carrier at a location outside of a vacuum deposition chamber, no monitoring member supply mechanism is required in the vacuum deposition chamber.

From the above, the vacuum coating apparatus according to the present invention can greatly contribute to the mechanization and automation of an entire deposition operation and to an effective deposition operation.

It is to be noted here that in the case where objects to be deposited are lenses, it is necessary to perform the deposition with high accuracy in thickness over the entire surfaces thereof. To this end, a monitoring member through which the state of deposited films formed on the lenses is monitored is provided on a carrier or a pallet in the above-described embodiment.

However, some objects, for example semiconductor wafers, do not require high accuracy in thickness. Accordingly, a vacuum coating apparatus for use in coating such objects has no monitoring member. In this case, a carrier for carrying the objects can also be rotated in order that considerably uniform films may be formed on the entire surfaces of the objects.

Figure 5:
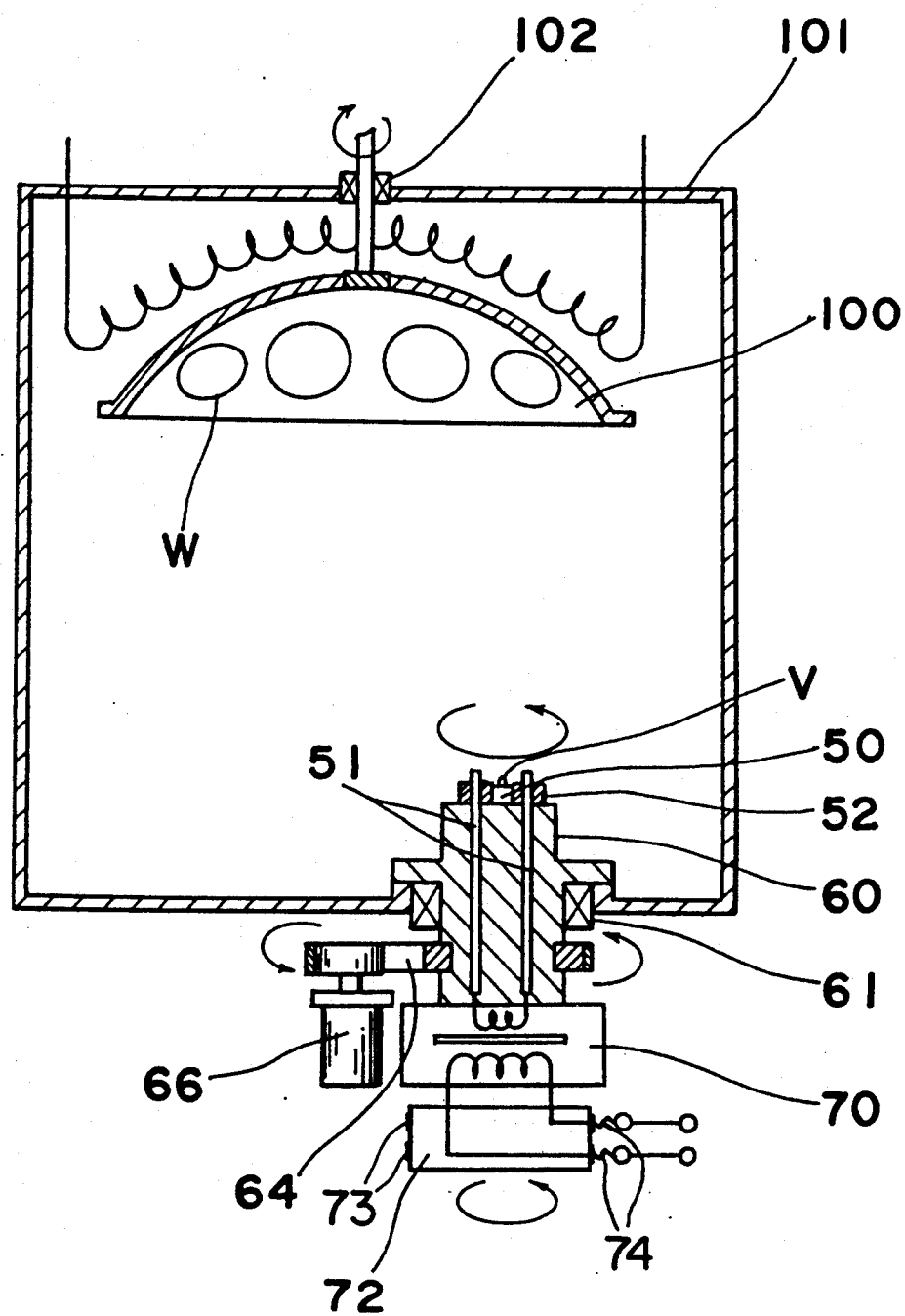
FIG. 5 is a schematic cross-sectional view of a vacuum coating apparatus embodying a modification of the present invention.

FIG. 5 depicts a vacuum coating apparatus having a rotary carrier 100, on which a plurality of semiconductor wafers W are mounted. The rotary carrier 100 is rotated by a drive means (not shown) located outside of a vacuum deposition chamber 101 via any suitable sealing means 102, for example a magnetic fluidic sealing mechanism. This vacuum coating apparatus is also provided with a rotary mechanism having the same construction as that shown in FIG. 4.

In this embodiment, since both the carrier 100 and boat 50 accommodating a material V to be evaporated are rotated simultaneously, considerably uniform films are formed on the entire surfaces of the wafers W.

The vacuum coating apparatus according to this embodiment is also free from problems in connection with lubrication, because no bearings are subjected to high temperature under vacuum.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A vacuum coating apparatus comprising:
   a vacuum deposition chamber from which air can be evacuated;
   a carrier accommodated in said vacuum deposition chamber and configured to carry objects to be coated;
   a rotary mechanism extending through a chamber wall of said vacuum deposition chamber and being rotatable with respect to said carrier;
   a heating element mounted on said rotary mechanism and accommodated in said vacuum deposition chamber, said heating element being configured to accommodate material to be evaporated and deposited on surfaces of objects carried by said carrier;
   a monitoring member mounted on said carrier;

film thickness measuring means, disposed outside of said vacuum deposition chamber, for measuring a thickness of films formed on surfaces of objects carried by said carrier by monitoring a thickness of a film formed on said monitoring member; and a conveyor supporting said carrier and automatically operable to convey said carrier between an atmosphere outside of said vacuum deposition chamber and the interior of said vacuum deposition chamber such that said carrier and objects carried thereby can be automatically conveyed from the atmosphere outside of said vacuum deposition chamber to the interior of said chamber and from the interior of said vacuum deposition chamber to the atmosphere outside of said chamber, and said conveyor being stoppable to position said carrier within said vacuum deposition chamber such that said heating element is rotatably by said rotary mechanism during a deposition operation while objects carried by said carrier are maintained stationary.

2. The vacuum coating apparatus according to claim 1, and further comprising a pair of electrically conductive rods extending through and secured to said rotary mechanism so as to undergo movement together therewith, wherein said heating element is connectable to a source of electric power via said paired rods so that particles evaporated from material accommodated in said heating element will be deposited on the surfaces of objects carried by said carrier.

* * * * *